US012322856B2

(12) United States Patent
Tang et al.

(10) Patent No.: US 12,322,856 B2
(45) Date of Patent: Jun. 3, 2025

(54) ANTENNA IN PACKAGE HAVING ANTENNA ON PACKAGE SUBSTRATE

(71) Applicant: Texas Instruments Incorporated, Dallas, TX (US)

(72) Inventors: Yiqi Tang, Allen, TX (US); Makarand Ramkrishna Kulkarni, Dallas, TX (US); Liang Wan, Chengdu (CN); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 506 days.

(21) Appl. No.: 17/138,557

(22) Filed: Dec. 30, 2020

(65) Prior Publication Data

US 2022/0209391 A1  Jun. 30, 2022

(51) Int. Cl.
*H01Q 1/22* (2006.01)
*H01L 21/48* (2006.01)
(Continued)

(52) U.S. Cl.
CPC ....... *H01Q 1/2283* (2013.01); *H01L 21/4853* (2013.01); *H01L 21/4857* (2013.01);
(Continued)

(58) Field of Classification Search
CPC .............. H01L 21/4853; H01L 21/4857; H01L 21/4871; H01L 21/563; H01L 21/565; H01L 21/568; H01L 21/6835; H01L 2221/68345; H01L 2221/68354; H01L 2221/68359; H01L 2221/68372;
(Continued)

(56) References Cited

U.S. PATENT DOCUMENTS 8,033,014 B2  10/2011  Yu et al.
10,475,786 B1 *  11/2019  Tang ....................... H01L 24/16
(Continued)

FOREIGN PATENT DOCUMENTS

WO  WO-2017111768 A1 *  6/2017  ......... H01L 23/5383

OTHER PUBLICATIONS

Stefan Wiktor, HotRod QFN Package PCT Attachment, Texas Instruments Application Report, Printed Circuit Board (PCB) Design Guidelines; SLUA715—May 2014; pp. 11.

*Primary Examiner* — Seokjin Kim
(74) *Attorney, Agent, or Firm* — Xiaotun Qiu; Frank D. Cimino

(57) ABSTRACT

An antenna in package (AIP) 400 includes an IC die 120 including bond pads 121 and a package substrate including the IC die mounted up and being completely embedded therein. The package substrate includes a top layer 418 including a top dielectric layer 418*b*, a top metal layer 418*a* including an antenna 418*a*1, and a bottom layer 415 including a bottom dielectric 415*b* and a bottom metal layer 415*a* including contact pads including a first contact pad 415*a*1, and filled vias 415*c*, 417*c*. The bond pads are electrically coupled by a connection including a filled via(s) for connecting to the top metal layer and/or the bottom metal layer. Metal pillars including a first metal pillar 132*a* are electrically are coupled to the first contact pad, and at least one filled via is electrically coupled to the first metal pillar for providing a transmission line from the first contact pad to the antenna.

11 Claims, 10 Drawing Sheets

(51) Int. Cl.
*H01L 21/56* (2006.01)
*H01L 21/683* (2006.01)
*H01L 23/00* (2006.01)
*H01L 23/31* (2006.01)
*H01L 23/367* (2006.01)
*H01L 23/538* (2006.01)
*H01L 23/66* (2006.01)
*H01P 3/08* (2006.01)
*H01Q 9/04* (2006.01)

(52) U.S. Cl.
CPC ........ *H01L 21/4871* (2013.01); *H01L 21/563* (2013.01); *H01L 21/565* (2013.01); *H01L 21/568* (2013.01); *H01L 21/6835* (2013.01); *H01L 23/3185* (2013.01); *H01L 23/367* (2013.01); *H01L 23/5383* (2013.01); *H01L 23/5386* (2013.01); *H01L 23/5389* (2013.01); *H01L 23/66* (2013.01); *H01L 24/16* (2013.01); *H01L 24/20* (2013.01); *H01L 24/48* (2013.01); *H01P 3/081* (2013.01); *H01Q 9/0407* (2013.01); *H01L 2221/68372* (2013.01); *H01L 2223/6616* (2013.01); *H01L 2223/6627* (2013.01); *H01L 2223/6677* (2013.01); *H01L 2224/16227* (2013.01); *H01L 2224/214* (2013.01); *H01L 2224/48227* (2013.01); *H01L 2924/15311* (2013.01); *H01L 2924/18161* (2013.01); *H01L 2924/19032* (2013.01)

(58) Field of Classification Search
CPC ..... H01L 2223/6616; H01L 2223/6627; H01L 2223/6677; H01L 2224/13101; H01L 2224/16227; H01L 2224/214; H01L 2224/24225; H01L 2224/2929; H01L 2224/29386; H01L 2224/32225; H01L 2224/48227; H01L 2224/73204; H01L 2224/73265; H01L 2224/73267; H01L 2224/92125; H01L 2224/92244; H01L 23/3128; H01L 23/3185; H01L 23/367; H01L 23/3677; H01L 23/4334; H01L 23/49811; H01L 23/49816; H01L 23/49822; H01L 23/49833; H01L 23/5383; H01L 23/5386; H01L 23/5389; H01L 23/66; H01L 24/16; H01L 24/19; H01L 24/20; H01L 24/24; H01L 24/29; H01L 24/32; H01L 24/48; H01L 24/73; H01L 24/82; H01L 2924/14; H01L 2924/15311; H01L 2924/16152; H01L 2924/181; H01L 2924/18161; H01L 2924/19032; H01P 3/81; H01Q 1/2283; H01Q 21/65; H01Q 9/407
See application file for complete search history.

(56) References Cited

U.S. PATENT DOCUMENTS

| | | | |
|---|---|---|---|
| 10,734,332 | B2 | 8/2020 | Lasiter et al. |
| 11,424,195 | B2 | 8/2022 | Shaul et al. |
| 11,424,197 | B2 | 8/2022 | Wang et al. |
| 11,600,902 | B2 * | 3/2023 | Baheti ............... H01L 24/05 |
| 2018/0350772 | A1 * | 12/2018 | Nair ................ H01L 23/66 |
| 2019/0067221 | A1 * | 2/2019 | Lasiter ............. H01Q 1/2283 |
| 2019/0304936 | A1 | 10/2019 | Shaul et al. |
| 2019/0348747 | A1 * | 11/2019 | Liu ................. H01L 23/5386 |
| 2020/0035625 | A1 | 1/2020 | Wang ............... H01L 23/3135 |
| 2020/0058606 | A1 * | 2/2020 | Tsai ................. H01L 23/481 |
| 2020/0176376 | A1 | 6/2020 | Ndip et al. |
| 2020/0219830 | A1 * | 7/2020 | Nair ................ H01L 23/5386 |
| 2020/0243464 | A1 * | 7/2020 | Hsu ................. H01L 23/49838 |
| 2020/0328167 | A1 * | 10/2020 | Chang Chien ........ H01L 21/561 |
| 2020/0335458 | A1 * | 10/2020 | Chen ................. H01Q 21/28 |
| 2020/0365455 | A1 * | 11/2020 | Liao ................ H01L 21/76837 |
| 2020/0403299 | A1 * | 12/2020 | Gupta ............... H01L 23/5389 |
| 2021/0020559 | A1 * | 1/2021 | Hung ................ H01Q 1/526 |
| 2021/0035930 | A1 | 2/2021 | Chi et al. |
| 2021/0091017 | A1 | 3/2021 | Yeon et al. |
| 2021/0249367 | A1 * | 8/2021 | Hsieh ................ H01L 23/49827 |
| 2021/0343665 | A1 * | 11/2021 | Chuang ............. H01L 23/49811 |
| 2021/0384130 | A1 * | 12/2021 | Cheah ............... H01L 24/17 |
| 2022/0006173 | A1 * | 1/2022 | Lee ................. H01L 23/49822 |
| 2022/0069439 | A1 * | 3/2022 | Kuo ................. H01Q 9/0407 |
| 2022/0336385 | A1 * | 10/2022 | Wang ............... H01L 23/49827 |
| 2023/0039444 | A1 * | 2/2023 | Wu ................. H01L 23/49816 |

* cited by examiner

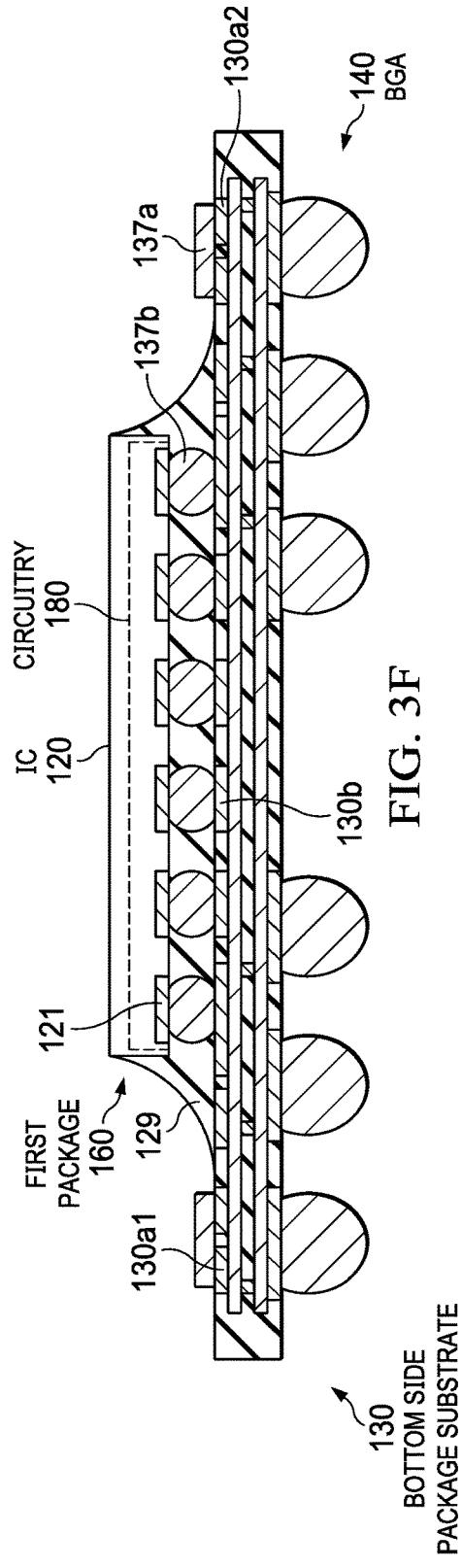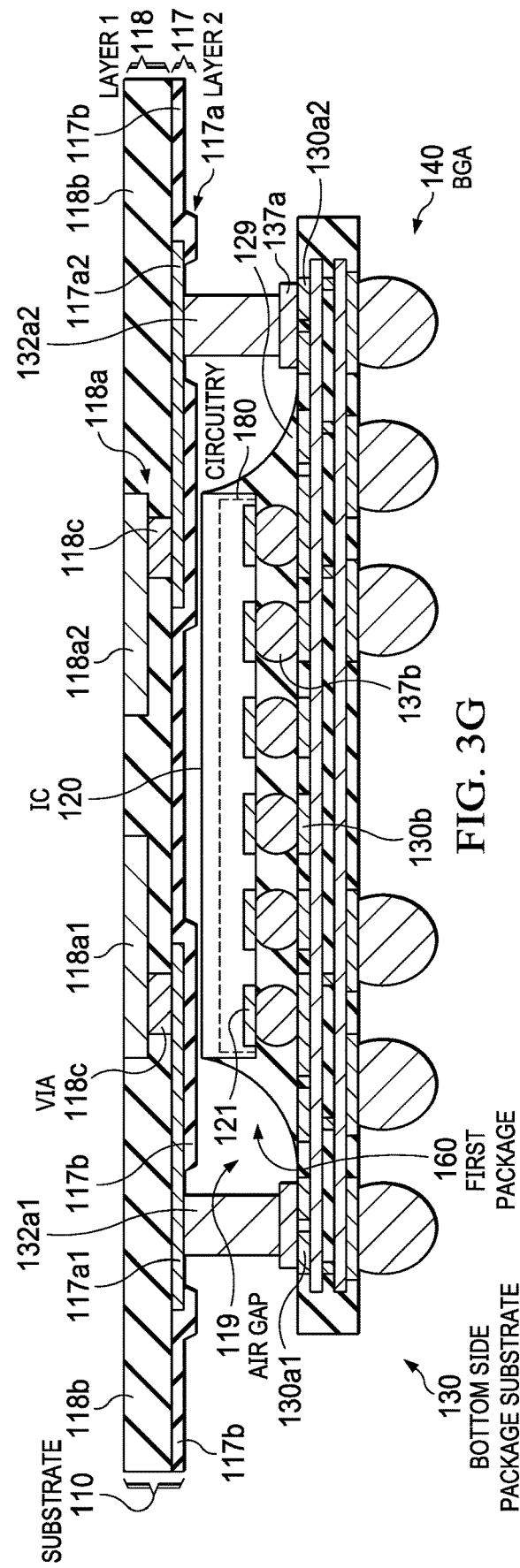

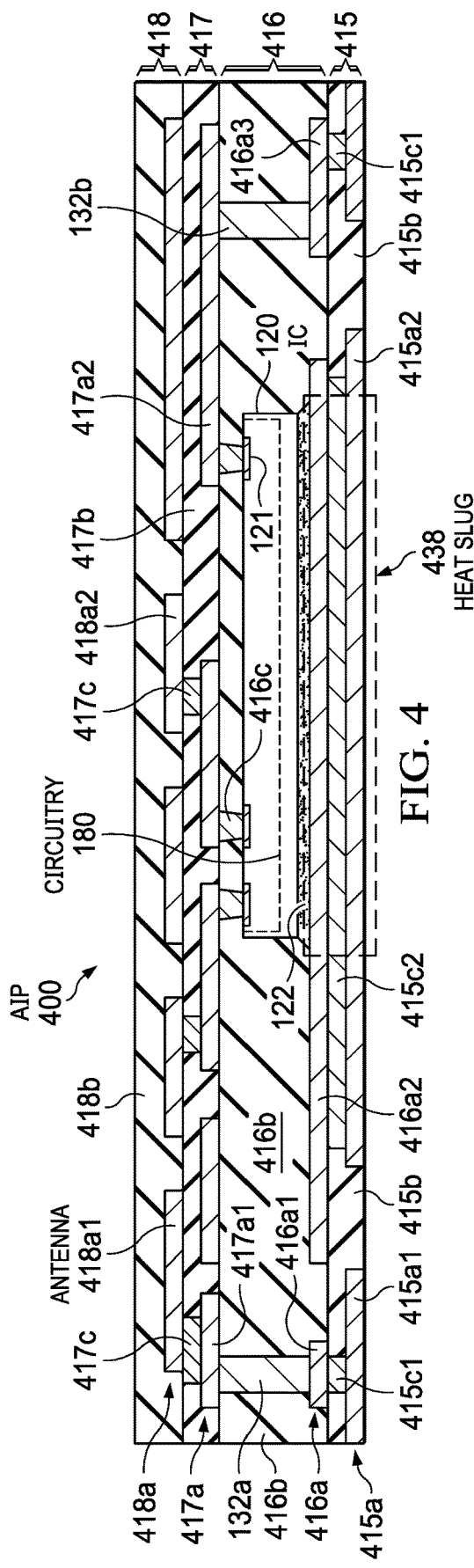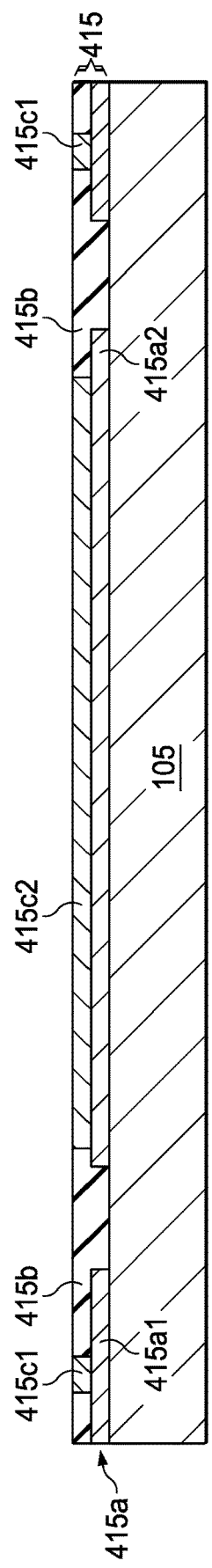

ANTENNA IN PACKAGE HAVING ANTENNA ON PACKAGE SUBSTRATE

FIELD

This Disclosure relates to packaged semiconductor devices known as an antenna in package (AIP) which include at least one integrated circuit (IC) die and an antenna.

BACKGROUND

AIP is a package arrangement where the antenna is integrated into the package along with IC(s) generally including a radio frequency IC (RFIC) to provide a wireless device. In this configuration, the antenna is not a separate component placed within the wireless device but is instead directly integrated into the package along with other IC(s). This approach is sometimes referred to as a discrete antenna approach. Other typical AIP components may include RF/millimeter (mm) wave building blocks, an analog baseband signal chain for transmitters and receivers, as well as a customer-programmable microcontroller unit (MCU) and a digital signal processor (DSP).

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a conventional AIP is implemented using an organic ball grid array (BGA) substrate. Conventional organic substrates comprise small organic molecules. Small organic molecules typically comprise polycyclic aromatic compounds, such as pentacene, anthracene, and rubrene. While generally able to meet the needed routing complexity, this known AIP arrangement generally has a plurality of drawbacks. Firstly, the antenna to ground plane distance which is recognized to control the radiation pattern produced by the antenna is determined by non-continuous layer thickness stacks. Secondly, it is difficult to implement an air-core for the antenna to lower the radiation loss if desired, or to implement a high dielectric-constant core for the antenna to reduce the package thickness if desired. Thirdly, the antenna feed transmission line performance can be compromised by monotonous and large size via structures that cannot be tuned or designed as a good transmission line. Also, the organic substrate generally comprises a moisture absorbent material that results in a delamination risk, where delamination can reduce the moisture shelf life (MSL) which refers to the length of time the product can be kept on the shelf before being mounted in its application on in a system.

Disclosed aspects include AIP's comprising a multilevel package substrate that includes an antenna on the top metal layer that enables better antenna performance, and thus improved AIP performance. There is believed to be no AIP solution known that provides the option for a low dielectric constant material at the package interface (transmission line or feed) with the antenna for enhanced antenna performance or provides flexibility/adaptability in the integration of different antenna configurations.

Disclosed AIP's combine both a cost effective and a high-performance AIP structure into one package solution. Disclosed aspects provide a flexible option of integrating a low-cost antenna on a leadframe to a standard package (e.g., wirebond, flipchip, wafer fan-out, ball grid array (BGA), wide flat no lead (QFN), and quad flat package (QFP)). There can optionally be an air gap between the antenna feed and the antenna which enables a high-performance integrated antenna in an AIP.

Disclosed aspects include an AIP that includes an IC die including bond pads and a package substrate including the IC die mounted top side up, where the IC die is completely embedded in the AIP. The package substrate includes a top layer including a top dielectric layer and a top metal layer including an antenna(s), and a bottom layer including a bottom dielectric layer and bottom metal layer that includes contact pads including a first contact pad. There are filled vias. The bond pads are electrically coupled by a die connection including filled via(s) for connecting to the top metal layer and/or connecting to the bottom metal layer. Metal pillars including a first metal pillar are electrically are coupled to the first contact pad, and at least one filled via is electrically coupled to the first metal pillar for providing a transmission line from the first contact pad to the antenna.

BRIEF DESCRIPTION OF THE DRAWINGS

Reference will now be made to the accompanying drawings, which are not necessarily drawn to scale, wherein:

FIGS. 3A-G includes successive cross-sectional views of an example assembly flow for a disclosed method of manufacturing the disclosed AIP shown in FIG. 1.

FIG. 4 is a cross-sectional depiction of an example AIP including a surrounded IC die. In this AIP, the dielectric filler material is selected to fill the trench around the IC die and provide a smooth surface for the redistribution lines.

FIGS. 5A-G includes successive cross-sectional views of an example assembly flow for a disclosed method of manufacturing the AIP shown in FIG. 4.

DETAILED DESCRIPTION

Figure 1:
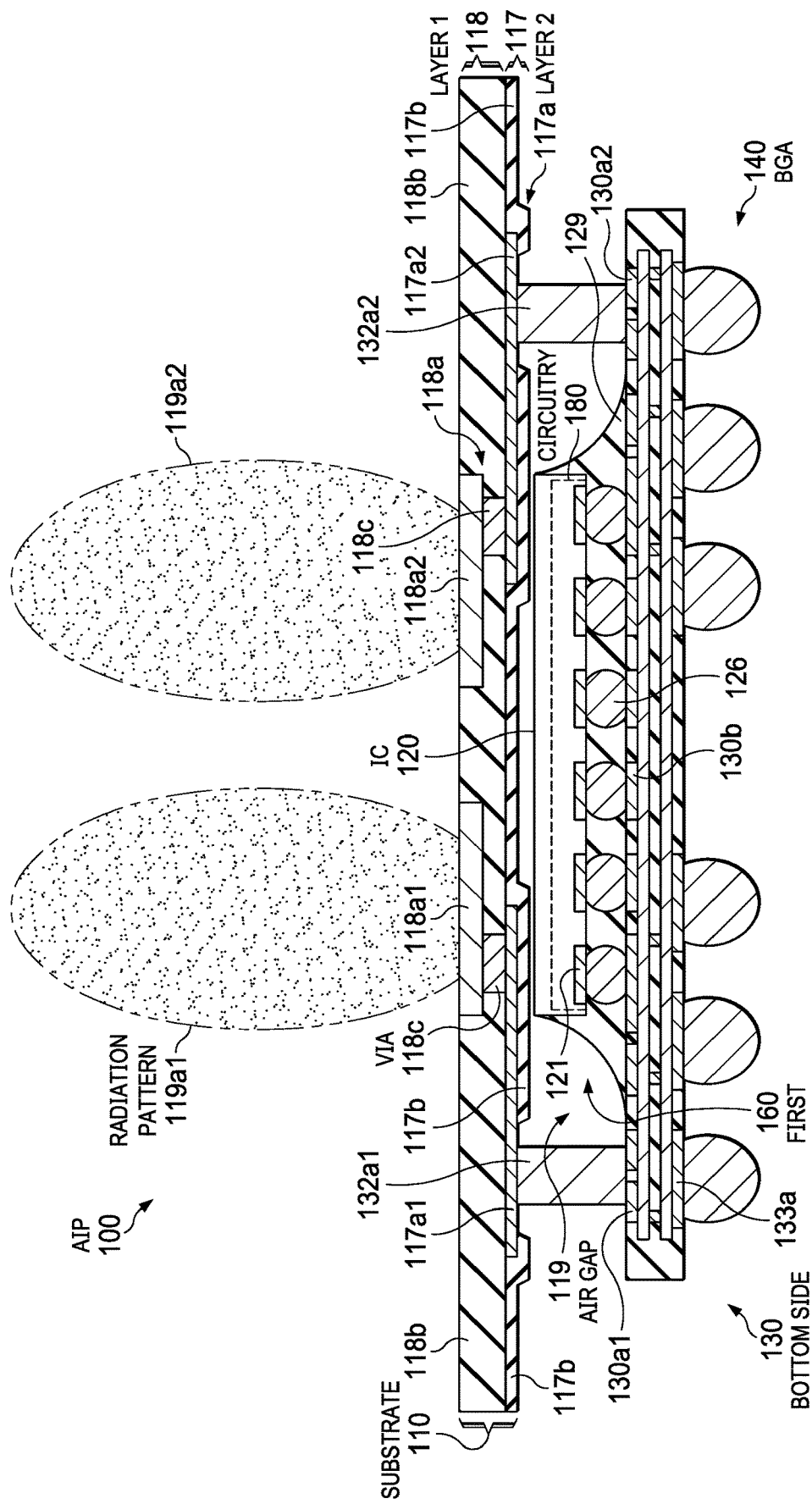
FIG. 1 is a cross-sectional view of a disclosed AIP comprising a top side package substrate including two antennas shown with their radiation patterns extending out from the antenna formed on the top side package substrate's top metal layer, where the top side package substrate is attached by metal pillars to a bottom side package substrate. The bottom side package substrate includes a flipchip mounted IC die thereon that together with the pillars and vias in the dielectric layer of the package substrate provides the feed to the antennas.

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device electrically "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Several terms used herein will now be defined. A package substrate for disclosed AIP's includes a top side package substrate and a bottom side package substrate, or in the case of an AIP having a single package substrate such as shown in FIG. 4 described below, is a particular package substrate arrangement that comprises a plurality (at least two) of stacked layers where each layer is pre-configured with metal plating such as copper plating or interconnects to provide electrical connections in the package. Such a package substrate is generally built by forming a dielectric layer such as a mold compound (generally comprising an epoxy material) or other organic compound(s) around a leadframe substrate comprising a metal material between a patterned top metal layer and a patterned metal bottom layer. Such package substrates can comprise single- or multi-die configurations, both lateral and vertically stacked, enabling low-profile, fine-pitch packages, which enable different stackups, material, and manufacturing process, that has recognized benefits when applied to an AIP as described herein 3 paragraphs below this paragraph.

An antenna as used herein comprises a metal comprising a structure which is configured to provide an interface between radio waves propagating through free space and electric currents that flow in the metal conductor of a package substrate, where the antenna is coupled for use with a transmitter and/or a receiver. For disclosed aspects, the antenna is formed on the top metal layer on the top side of the AIP, and there may also be an optional ground plane on the bottom metal layer of the package substrate below the antenna.

An IC die as used herein comprises a substrate having at least a semiconductor surface (generally an all-semiconductor substrate, such as comprising silicon having an optional epitaxial layer thereon), where there were circuit elements (including transistors, and generally diodes, resistors, capacitors, etc.) formed in the semiconductor surface that are configured together for generally realizing at least one circuit function. Various nodes of the circuitry are coupled to bond pads on the top side of the IC, where the bond pads generally comprise the top layer metal. In the case of disclosed AIPs, the IC(s) generally include at least a radio frequency (RF) IC.

Disclosed AIPs including a package substrate that provides the antenna which provides several significant advantages. First, the antenna to ground distance is tunable continuously which enables an improved radiation pattern. This tunable ground distance is achieved by adjusting the dielectric thickness (e.g., a backgrinding process), and in another configuration, by the vertical connector (e.g., copper (Cu) interconnect pillar) height, where the vertical connector is typically implemented by a plating process. Second, an air core, or alternatively a high dielectric constant core, is made possible with the vertical connector process. Third, with package substrates generally making available any-shape-via technology, where the vias can be plated to form generally any shape including a possible coaxial-shape for the transmission line, this provides for improved isolation and impedance matching for the antenna. Also, the design rules for a package substrate are better as compared to a conventional organic BGA substrate.

With only one dielectric material (such as a mold compound typically comprising an epoxy material) and copper optionally as the metal for the metal layers of the various layers and the vertical connectors used in disclosed configurations, the coefficient of thermal expansion (CTE) mismatch between the dielectric material and the metal is significantly less. Moreover, the mold compound used as a dielectric material for the package substrate is recognized to be less moisture absorbent as compared to an organic substrate material, and the mechanical performance is also better as compared to an organic substrate. Moreover, package substrate design rules which relate to the transmission metal line routing that electrically connect to the antenna can range is as low as 5 µm/5 µm for metal line width and line spacing. These design rules can be compared to a design rule of about 30 µm/30 µm for a conventional organic substrate.

FIG. 1 is a cross-sectional view of a disclosed AIP 100 comprising a top side package substrate 110 shown as a two-layer substrate shown including layer 1 118 and layer 2 117. Layer 1 includes a metal layer 118a that includes an antenna(s) shown by examples having an array of antennas comprising antennas 118a1, 118a2, and a dielectric layer 118b having a filled via 118c under the respective antennas. Layer 2 117 includes a metal layer 117a including a first contact pad 117a1 and a second contact pad 117a2 that are electrically coupled to the antennas 118a1, 118a2 by filled vias 118c for the dielectric layer 118b. The antennas 118a1, 118a2 are shown with their respective example radiation pattern 119a1, 119a2 extending outward from the package substrate 110. A width and a line spacing for at least a portion of features of the metal layers 118a and 117a can include a dimension that is less than or equal to 10 µm.

The first and second contact pads 117a1, 117a2 as described above are electrically coupled by filled vias 118c to the antennas 118a1, 118a2, are attached and are electrically coupled to by the vertical connector shown by example as a first metal pillar 132a1 and a second metal pillar 132a2 that connects to the first metal pad 130a1 and second metal pad 130a2, respectively on a top metal layer on a top side of the bottom side package substrate 130. The top metal layer of the bottom side package substrate 130 also includes third metal pad 130b which aligned with the bond pads 121 of the IC die 120.

The bottom side package substrate 130 includes a flipchip mounted IC die 120 comprising circuitry 180 having selected nodes in the circuitry 180 connected to the bond pads 121 on the top (active) side surface of the IC die 120. In several examples, the terms "flipchip mounted" or "flipchip attached" include the IC die 120 where the active side surface of the IC 120 faces the bottom side package substrate 130. There are solder balls 126 between the bond pads 121 and the third metal pad 130b. Underfill material, which is optional, is shown as 129. Underfill material is a thermoset epoxy that includes silicon oxide particles. The solder balls 126 and the IC die 120 together with the underfill 129 forms a first package similar to a ball grid array (BGA) package shown in FIG. 1 as a first package 160 that is preformed and attached to the bottom side package substrate 130.

A path through the thickness of the bottom side package substrate 130 together with the first pillar 132a1 and second pillar 132a2 including a filled via 118c provides a transmission line (feed) for the respective antennas 118a1, 118a2. There is an air gap 119 shown provided between the pillars 132a1 and 132a2 associated with the transmission line to the respective antennas 118a1, 118a2 which is recognized to improve the performance of the antennas 118a1, 118a2. The air gap 119 surrounds the first package 160 from all vertical sides and the top side.

The ground plane for the antennas 118a1, 118a2 for the AIP 100 shown in FIG. 1 is provided by metal areas provided on a top side of the bottom side package substrate 130. On a bottom side of the bottom side package substrate 130 there is shown a ball grid array (BGA) 140 that is coupled to metal pads 133a on a bottom side of the bottom side package substrate 130. Although not shown in FIG. 1, a ground plane for the antenna 118a1, 118a2 can also be provided by the metal layer 117a. Although not shown, there are generally other metal features in the respective metal layers 117a, 118a beyond those shown in FIG. 1, which are generally connected by filled vias 118c and 117c through the respective dielectric layers 118b, 117b that can contact the bottom side package substrate 130, such as by others of the pillars shown. Besides the microstrip/patch antenna shown in FIG. 1, the antenna(s) 118a1, 118a2 alternately can comprise other types of antennas including an array of patch antennas (a patch array), a Vivaldi antenna, a horn antenna, a Yagi-Uda antenna, or a bow-tie antenna.

A thickness of the AIP 100 can be less than or equal to 600 μm, such as about 450 to 500 μm. Generally, any of the above-described dielectric layers can comprise an epoxy material such as Ajinomoto Build-up Film (ABF) which is known to comprise an epoxy and have a reported dielectric constant (Er) of 3.1-3.3 with a loss tangent of 0.012. The antenna(s) can comprise a millimeter wave antenna, where the millimeter-wave region of the electromagnetic spectrum is commonly defined as the 30 GHz to 300 GHz frequency band, equivalent to the 1 cm to 1 mm wavelength range. The IC die 120 can comprise a radio frequency (RF) die, generally comprising a transceiver including Low Noise Amplifiers, Mixers, Clock generators, Power Amplifiers. Duplexer and passive components (Inductor, Capacitor, and transformer). A width and a line spacing for the top metal layer and the bottom metal layer of the package substrate can each include a dimension that is less than or equal to 10 μm.

Figure 2:
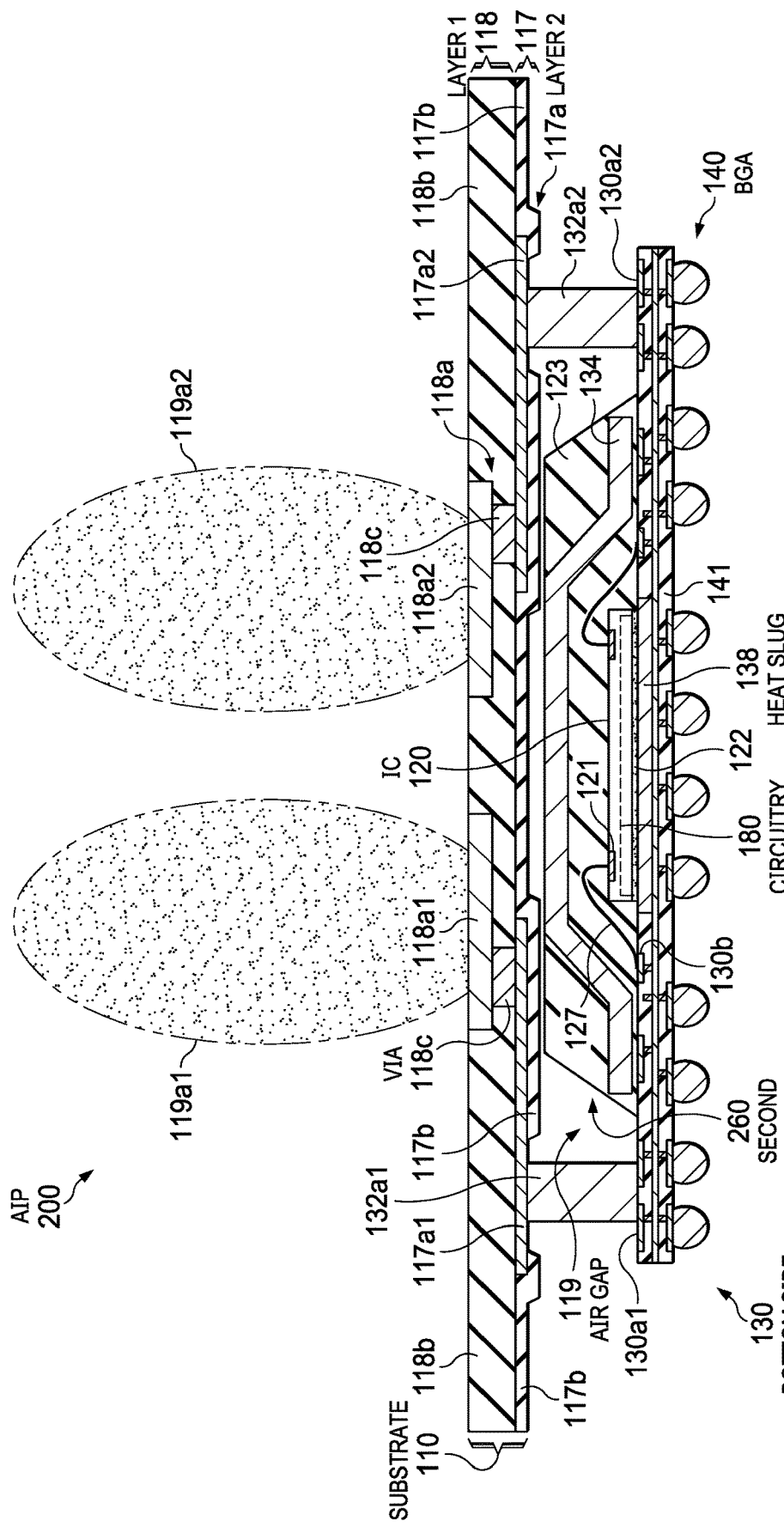
FIG. 2 is a cross-sectional view of another example AIP comprising a top side package substrate including an antenna on its top metal layer mounted by pillars to the bottom side package substrate, where the bottom side package substrate has an IC die mounted with its top side up, and there are bond wires that electrically couple the bond pads on the IC die to metal pads on the bottom side package substrate. In this arrangement, there is shown the bottom side package substrate providing an optional metal heat slug positioned underneath the IC die.

FIG. 2 is a cross-sectional view of another example AIP 200 comprising the package substrate 110 shown in FIG. 1, where now the bond pads 121 of the IC die 120 are wirebonded by bond wires 127 to the third metal pads 130b on the bottom side package substrate 130. In this arrangement, there is shown the bottom side package substrate 130 providing an optional metal heat slug 138 which is positioned underneath the IC die 120 to enhance the heat dissipation from the IC die 120 during its operation. There is a die attach material 122 that is generally electrically and thermally conductive between the bottom side of the IC die 120 and the heat slug 138, where the die attach material 122 can comprise silver-filled epoxy or solder. Mold compound is shown as 123.

There is also shown a 'top-hat' thermal lid 134 comprising a metal above the IC die 120, for improved heat dissipation and for providing added protection for the IC die 120. There is no electrical coupling of the lid 134 to the package substrate 110 needed. The attachment of the lid 134 to the bottom side package substrate 130 is generally through a lid attach dielectric adhesive material, such as comprising an epoxy. The mold compound shown as 139 is for encapsulating the IC die 120. The bond wires 127 and the IC die 120 together with the mold compound 123 optional lid 134 forms a second package similar to wire bond package shown in FIG. 2 as a second package 260 that is preformed and attached to the bottom side package substrate 130.

Figure 3A:
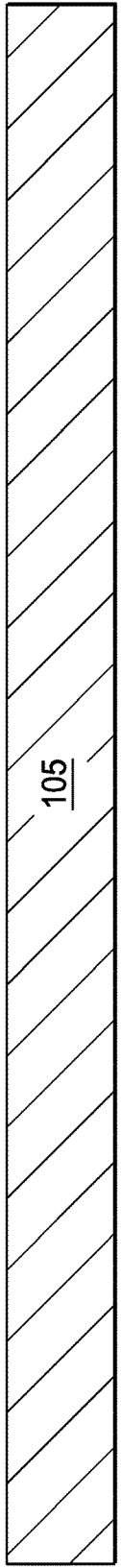
Figure 3B:
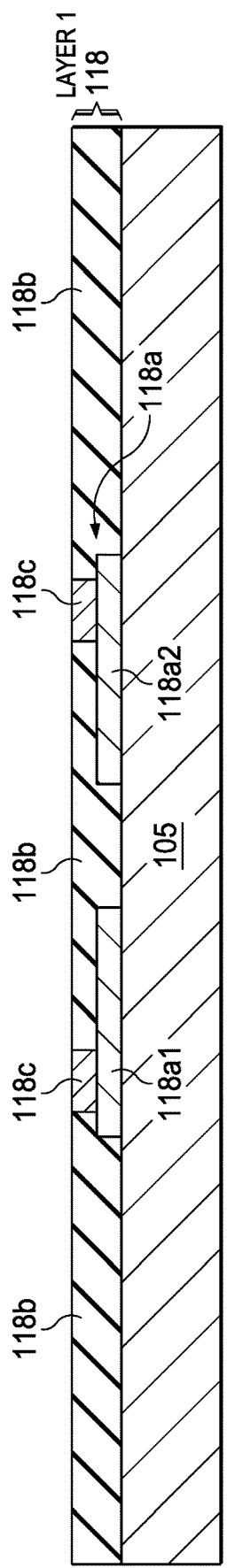

FIGS. 3A-G include successive cross-sectional views of an example assembly flow for forming the disclosed AIP 100 shown in FIG. 1. FIG. 3A shows a metal carrier 105 that can be used to build the package substrate 110. FIG. 3B shows the results after forming the first layer 118 on the metal carrier 105. The first layer 118 includes a metal layer 118a including metal features that are used to provide the antennas 118a1, 118a2, a dielectric layer 118b, and filled vias 118c shown in FIG. 3B over the antennas 118a1, 118a2. The metal features are generally deposited using plating or sputtering first. Then, a dielectric layer is deposited on the metal carrier 105 covering the metal features. Vias are then formed generally using chemical etching or laser drilling, and thereafter plated with metal (for example copper) to form filled vias 118c. Because the package substrate 110 is assembled on top of a molded package including the IC die 120 on the bottom side package substrate 130 as shown in FIG. 3G described below, the filled vias 118c will thus be under the antennas 118a1, 118a2 for the AIP 100 shown in FIG. 1.

Figure 3C:
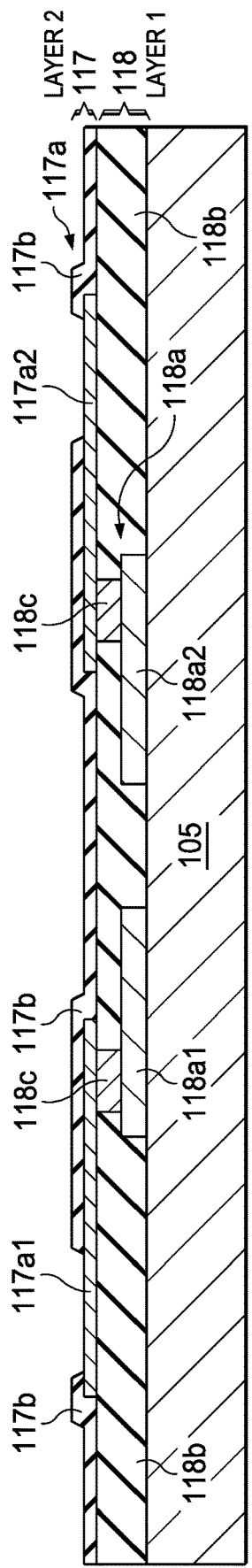
Figure 3D:
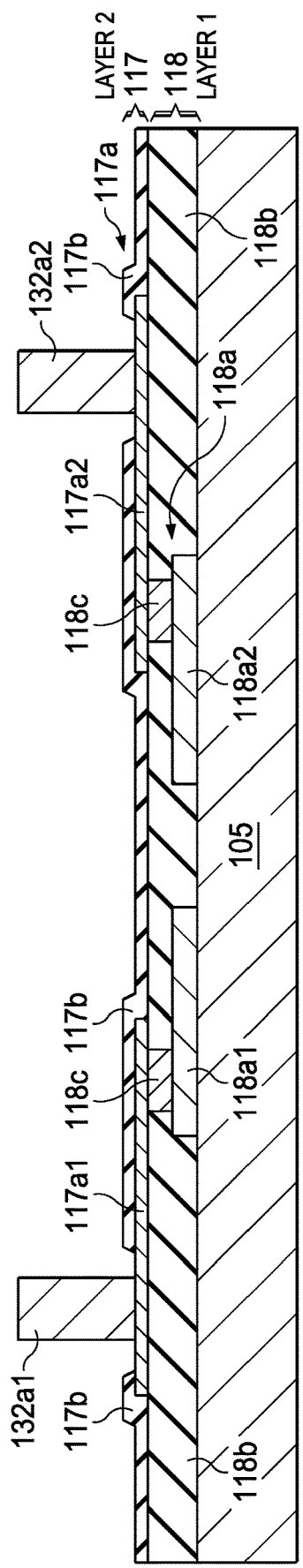

FIG. 3C shows the results after forming the second layer 117 on top of the first layer 118. The second layer 117 includes a metal layer 117a including the first contact pad 117a1 and the second contact pad 117a2 over the filled vias 118c for the dielectric layer 117b. The second layer 117 is formed by depositing metal at designated locations on the first layer 118 using suitable techniques, including plating. FIG. 3D shows the results after forming the vertical connectors shown as pillars 132a1, 132a2 on the first and second contact pads 117a1, 117a2 which are exposed by apertures in the dielectric layer 117b. The pillars 132a1, 132a2 shown may be formed by a plating process that utilizes a masking layer pattern to enable forming the pillars selectively on the surface. The plating process includes depositing a sacrificial mask layer such as a photomask (not shown), creating openings in the sacrificial mask layer, depositing metal in the openings, and removing the sacrificial mask layer leaving the pillars 132a1, 132a2.

Figure 3E:
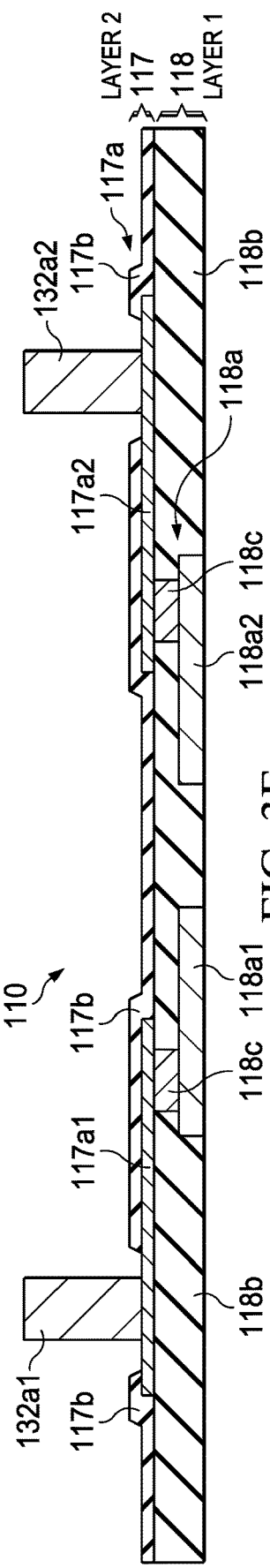

However, besides pillars 132a1, 132a2, other coupling arrangements can be used such as using solder balls, or an electrically conductive attach material. The structure shown in FIG. 3D is package substrate described above and shown as 110 on a metal carrier 105. FIG. 3E shows the results after removing the metal carrier 105 from the structure shown in FIG. 3D, such as by etching off the metal carrier 105 to provide the package substrate. Although not shown, multiple ones of the package substrates 110, as shown in FIG. 3E, can be formed together in a sheet and singulated at this stage to separate individual units using, for example, mechanical sawing.

FIG. 3F shows the results after forming a patterned solder layer including solder features 137a on the first and second metal pads 130a1, 130a2 on a top surface of the bottom side package substrate 130 that includes a bottom side BGA 140 FIG. 3F shows the first package 160 shown in FIG. 1 attached to on a top surface of the bottom side package substrate 130. The first package as noted above is preformed, is then attached to the bottom side package substrate 130 using solder features 137b shown as solder balls on the third metal pads 130b aligned with the bond pads 121 of the IC die 120. Underfill material is deposited after attaching the first package 160 to the bottom side package substrate 130. The underfill material 129 is shown to cover a top edge of each of the sides of the IC die 120 in this example. In another example, the underfill material 129 does not contact the top edge of each of the sides of the IC die 120, and instead wicks up only about half of each of the sides.

The bottom side package substrate 130 may be formed using patterning and etching that forms various metal features within, similar to forming the top side package substrate, including layers 117, 118. The top side package substrate 110 as shown in FIG. 3E is then flipped such that the edges of the pillars 132a1, 132a2 face towards the bottom side package substrate 130, and thereafter attached to the bottom side package substrate 130. FIG. 3G shows the results after attaching the package substrate shown as 110 by positioning the pillars 132a1, a2 on the first and second metal pads 130a1, 130a2. Although not shown, multiple ones of the bottom side package substrate 130 can be present as a sheet, and therefore, multiple individual package substrates 110 can be attached at designated places of the bottom side package substrate 130. Subsequent processing generally comprises solder reflow and then sawing the bottom side package substrate 130 to generate individual AIP's 100.

FIG. 4 is a cross-sectional depiction of an example AIP 400 comprising a package substrate having four layers shown as 418 being layer 4 (top layer) on layer 3, with layer 3 on layer 2 which is on layer 1 (bottom layer). Layer 4 418 comprises metal layer 418a including antenna 418a1 and metal traces 418a2 and a dielectric layer 418b. Although not shown in the view provided the dielectric layer 418b can optionally include apertures to expose the antenna 418a1. Layer 3 417 comprises metal layer 417a including metal pads 417a1, 417a2, and a dielectric layer 417b, and Layer 2 416 comprises metal layer 416a that includes metal layer portion 416a1, a metal layer portion 416a2, a metal layer portion 416a3, and dielectric layer 416b. Layer 1 415 comprises a metal layer 415a including first metal layer portion 415a1 and a second metal layer portion 415a2, a dielectric layer 415b, and filled vias including a first filled via 415c1, and a filled via area 415c2 that provides a portion of the heat slug 438. The metal traces 418a2 through connections including the filled vias 417c are for electrically contacting the metal pads 417a2 through filled vias 416c to electrically contact bond pads 121 on the IC die 120

The bottom side of IC die 120 is attached by a die attach material 122 that is generally electrically and thermally conductive to a metal stack that provides a metal heat slug shown as heat slug 438 provided by metal layer portion 416a2 on filled via area 415c2 on the metal layer portion 415a2. The IC die 120 is a surrounded IC die 120, with the sidewalls of the IC die 120 surrounded by dielectric layer 416b, except on its top side by the presence of filled vias 416c that make electrical contact to the bond pads 121 of the IC die 120. For AIP 400, the dielectric filler material for dielectric layer 416b is selected to fill the trench around the IC die 120 and provide a smooth surface for the metal lines.

Figure 5B:
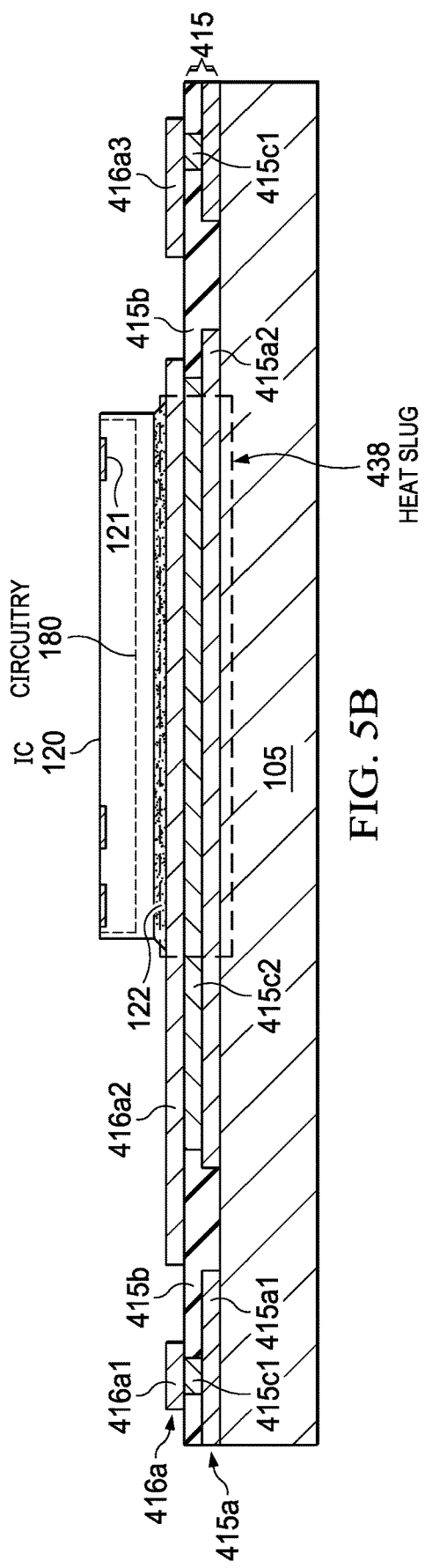

FIGS. 5A-G includes successive cross-sectional views of an example assembly flow for forming the packaged semiconductor device comprising the AIP 400 shown in FIG. 4. FIG. 5A shows the results after forming layer 1 415 on a carrier again shown as a metal carrier 105. FIG. 5B shows the results after forming the metal layer 416a comprising metal layer portion 416a1, metal layer portion 416a2 which as described above is part of the heat slug, and metal layer portion 416a3, which is on top of the filled via area 415c2 which is on metal layer portion 415a2, and then attaching the IC die 120 top side up with the die attach material 122 shown attaching the bottom side of the IC die 120 to the metal layer portion 416a2 which is described above is part of the heat slug 438.

Figure 5C:
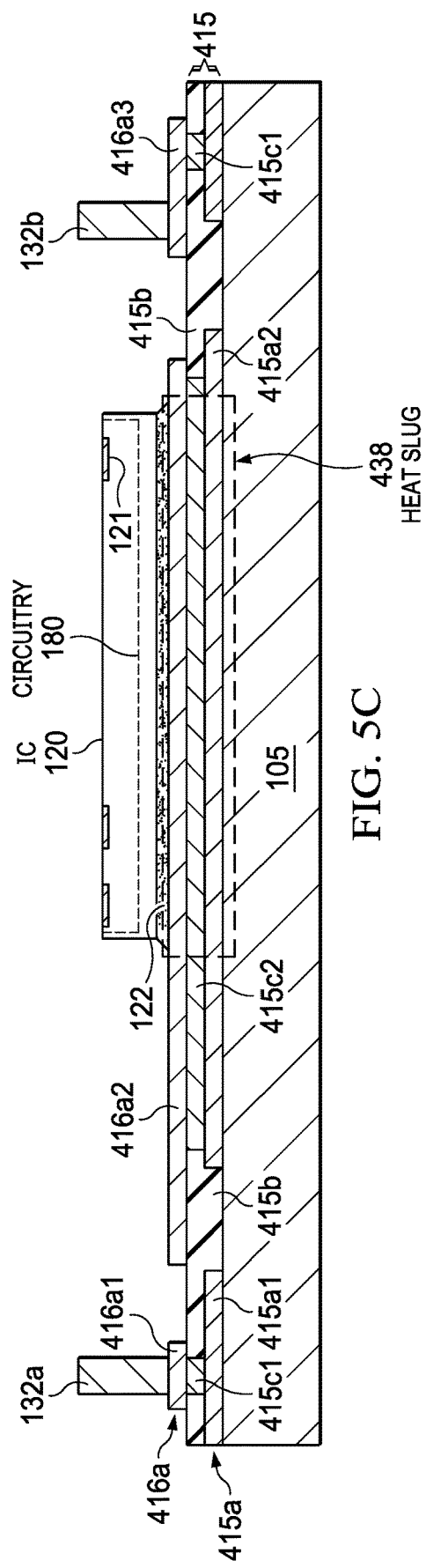

FIG. 5C shows the results after forming metal pillars 132 on metal layer portion 416 a1. The forming of the metal pillars 132 generally comprises first forming a masking layer pattern with apertures in the locations to form the metal pillars 132. The forming of the metal pillars can comprise an electroplating process, where the metal layer 416a provides the seed layer for forming the metal pillars 132.

Figure 5D:
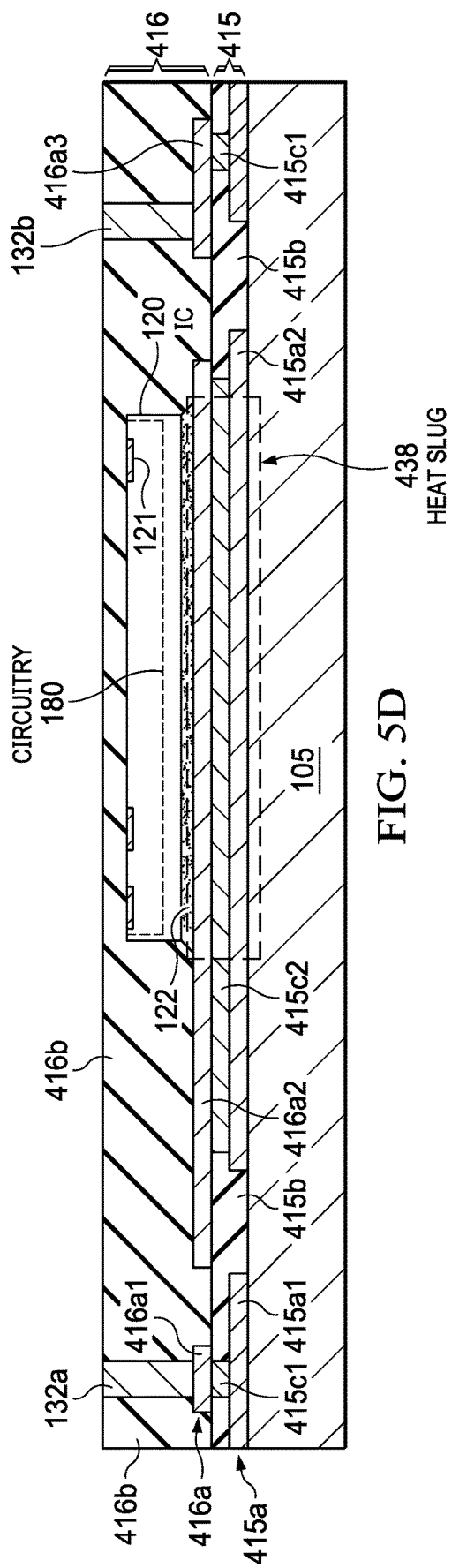
Figure 5E:
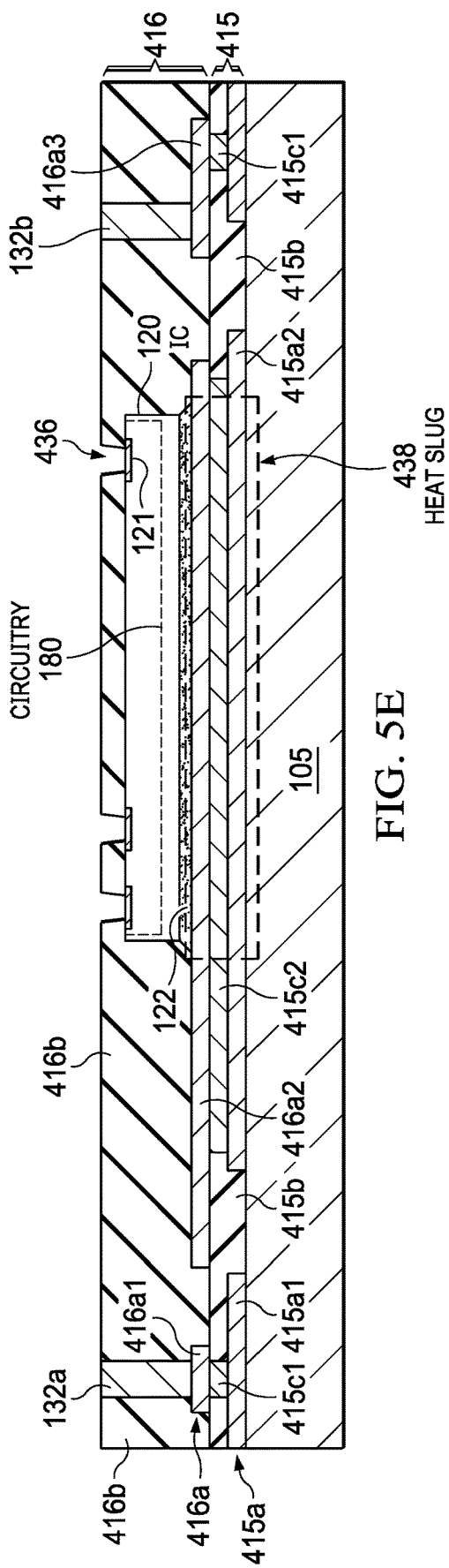
Figure 5F:
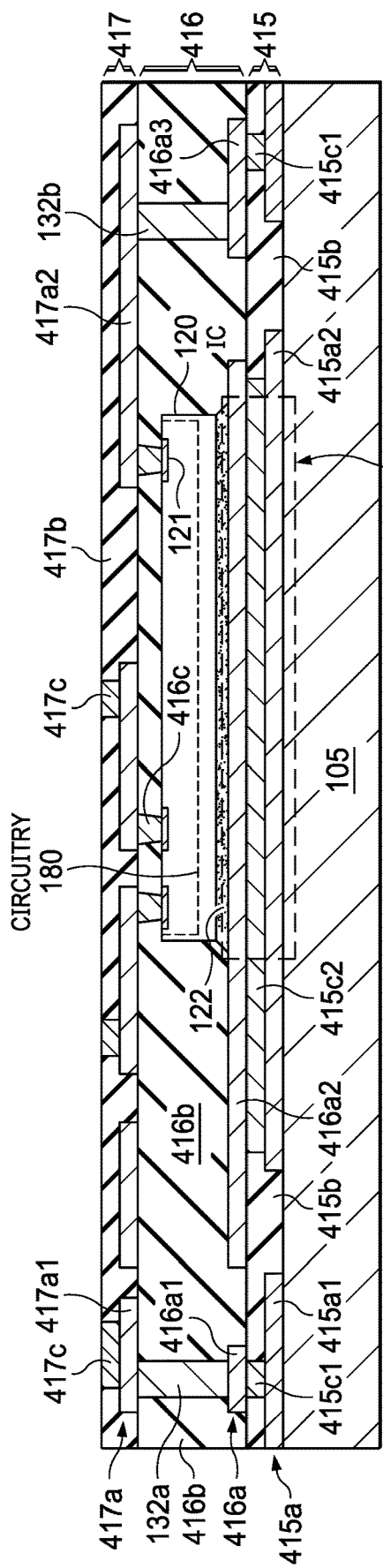
Figure 5G:
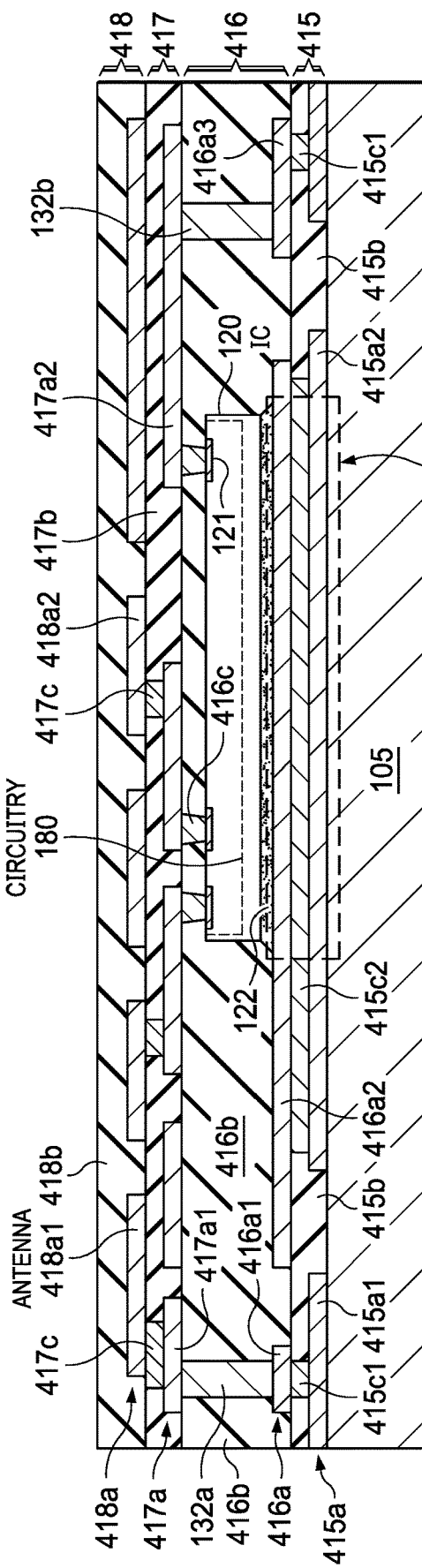

FIG. 5D shows the results after forming a mold compound to provide dielectric layer 416b including to encapsulate the IC die 120, and then generally grinding the dielectric layer 416b to reach the top surface of the pillars 132. FIG. 5E shows the results after drilling or other suitable selective removal process that can comprise laser drilling to form apertures 436 in the dielectric layer 416b, where the apertures 436 extend to reach the bond pads 121 of IC die 120. FIG. 5F shows the results after forming layer 417 including a metal layer 417a and a dielectric layer 417b, where the metal layer 417a includes filled vias 417c in the dielectric layer 416b. FIG. 5G shows the results after forming layer 4 418 which includes a metal layer 418a that provides the antenna 418a1 and the metal trace 418a2 shown electrically contacting the bond pads 121, and a dielectric layer 418b. The metal carrier 105 is then etched off to provide the AIP 400 shown in FIG. 4. Although not shown, multiple ones of the in-process AIP 400 can be present as a sheet, and therefore, multiple in-process AIP 400 can be attached together during the above-described processing. Subsequent processing in this case generally includes sawing to generate individual AIP's 400.

Figure 6:
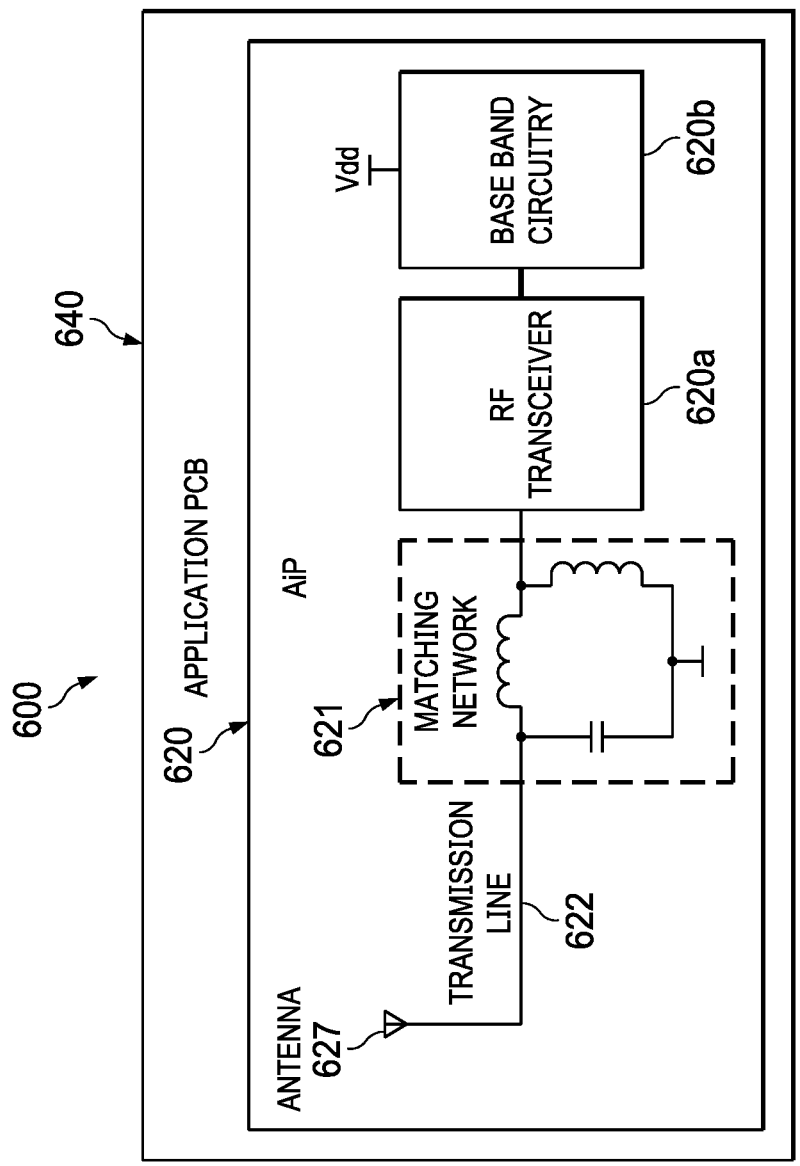
FIG. 6 depicts an application PCB along with a disclosed fully integrated AIP mounted onto the application PCB.

FIG. 6 depicts an arrangement 600 comprising an application PCB 640 along with a disclosed AIP shown as 620 mounted onto the application PCB 640. The AIP 620 is shown including an antenna 627, that is coupled by a transmission line 622 to a matching network 621 that is coupled to an RF transceiver 620a which can comprise an IC or a system-on-a-chip (SOC), which has its outputs coupled to baseband circuitry 620b that can also comprise an IC or a SOC.

Disclosed aspects also include methods for manufacturing an AIP. A first method for manufacturing an AIP corresponding to AIP 100 or AIP 200 described above comprises providing a top side package substrate 110 on a carrier, the top side package substrate comprising a first layer 118 on a carrier 105 including a first dielectric layer 118b and a first metal layer 118a providing at least one antenna 118a1, 118a2, and filled vias 118c above the antenna(s) extending to a top side of the first dielectric layer, and a second layer including a second dielectric layer 117b and a second metal layer 117a including a first contact pad 117a1 and a second contact pad 117a2 that electrically contact the filled vias 118c and provide surface contacts extending through the second dielectric layer. Vertical connectors such as pillars 132a1, 132a2 are formed (e.g., plating copper pillars) on the first contact pad 117a1 and the second contact at 117a2, respectively.

The carrier 105 is then removed. An IC die 120 is attached to a top metal layer of a bottom side package substrate 130, where the top metal layer also includes a first metal pad 130a1, second metal pad 130a2, and a third metal pad(s) 130b. The IC die 120 comprises a substrate including a top side semiconductor surface including circuitry 180 including a plurality of bond pads 121 thereon electrically connected to nodes in the circuitry. As noted above, the attaching can be a flipchip mounting or mounting with the top side of the IC die up using bondwires 127 that connect to the third metal pads 130b.

The first vertical connector such as the pillars 132a1 and 132a2 are then attached to the first metal pad 130a1 in the second metal pad 130a2, respectively. The bottom side package substrate 130 also includes a bottom side. The third metal pad 130b is for electrically coupling to the plurality of bond pads 121. The vertical connectors, such as pillars 132a1 132 2 being between the metal pad 130a1 and 130a2 and the first contact pad 117a1 and the second contact pad 117a2 provides a transmission line for the respective antennas 118a1 and 118a2. There is an air gap 119 around the vertical connectors and the antennas.

The second method for manufacturing an AIP corresponding to AIP 400 described above comprises forming a first layer 415 on a carrier 105 including a first dielectric layer 415b and a first metal layer 415a including an inner metal pad 415a2 extending to a top side of the first dielectric layer 415b and outer first metal features including a first contact pad 415a1, and filled vias 415c1, 415c2 above the first metal features extending to a top side of the first dielectric layer 415b. A second metal layer 416a is formed including second metal traces 416a1 that electrically contacts the filled vias 415c1, c2 and a metal die attach pad 416a2 is also formed on the inner metal pad 415a2. An IC die 120 is attached with its top side up onto the die attach pad 416a2. Metal pillars 132 are formed (e.g., plating for forming copper pillars) including a first metal pillar 132a and a second metal pillar 132b. On the second metal traces, the metal pillars extending above the top side of the IC die. Molding and then generally grinding forms a mold layer 416b that is planar relative to a top of the metal pillars. Apertures are formed (such as using laser drilling) through the mold layer to reach the bond pads.

A third layer 417 is formed comprising a third dielectric layer 417b and a third metal layer 417a including third metal traces 417a1 and 417a2 with filled vias 417c above the third metal traces extending to a top of the third dielectric layer, the third metal traces 417a2 having filled vias 416c thereunder electrically contacting the bond pads. A fourth layer 418 is then formed including a fourth dielectric layer 418b including a fourth metal layer 418a including an antenna 418a1, and metal traces 418a2 that are part of connections including the filled vias 417c for electrically contacting the third metal traces 417a2 that through the filled vias 416c reach the bond pads 121. At least one of the plurality of filled vias 417c is electrically coupled to the first metal pillar 132a for providing a transmission line from the first contact pad 415a1 to the antenna 418a1. The carrier 105 is then removed, such as by etching off the carrier.

Advantages of using a disclosed AIPs include relatively fine design rules and flexibility to develop a family of antennas. Directivity can be designed in (Low gain and wide field of view (FOV) vs. high gain and narrow FOV), and possible polarization (linear polarization (LP) vs circular polarization (CP antennas)) are all possible. Selectable beam direction (Broadside vs. end-fire) is provided, and generally, any shape vias or pillars are possible, with the capability of a coaxially structured via for the transmission line feed the antenna to provide reduced insertion loss (IL) and return loss (RL), and to provide better isolation against crosstalk. In the case the vertical connectors comprise pillars, there is provided customizable pillar height providing finer process control as compared to conventional solder ball interconnects. Also, a transmission line with air core, or alternatively a high dielectric constant dielectric core, can provide benefits of lower insertion loss, higher bandwidth, and can help eliminate substrate modes. Moreover, disclosed AIPs enable a relatively wide antenna bandwidth and relatively high performance, as well as lower cost because disclosed AIPs results in a lower substrate layer count and/or avoidance of conventional expensive AIP solutions.

Disclosed aspects can be integrated into a variety of assembly flows to form a variety of different AIPs and related products. The semiconductor device can comprise single IC die or multiple IC die, such as configurations comprising a plurality of stacked IC die, or laterally positioned IC die. The IC die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An antenna in package (AIP), comprising:
a top side package substrate including a top metal layer including an antenna and a bottom metal layer separated from the top metal layer by a dielectric layer that includes filled vias, the bottom metal layer including a plurality of contact pads including a first contact pad and a second contact pad;
an integrated circuit (IC) die comprising a substrate including a top side semiconductor surface including a plurality of bond pads thereon;
a bottom side package substrate including a bottom side, and a top side having a plurality of metal pads including a first metal pad and a second metal pad, the first metal pad for electrically coupling to vertical connectors, and the second metal pad for electrically coupling to the plurality of bond pads; and
the vertical connectors including at least a first vertical connector attached via solder to the first metal pad, and attached to the first contact pad without solder.

2. The AIP of claim 1, wherein the bottom side package substrate further comprises a ball grid array (BGA) on the bottom side of the bottom side package substrate.

3. The AIP of claim 1, wherein the IC die is flipchip attached to the second metal pad.

4. The AIP of claim 1, wherein the IC die is wirebonded by wirebonds between the plurality of bond pads and the second metal pad, and wherein the IC die is part of a packaged device which includes an encapsulation layer for the IC die.

5. The AIP of claim 4, wherein the bottom side package substrate provides a metal heat slug positioned beneath a bottom side of the IC die.

6. The AIP of claim 1, wherein the dielectric layer comprises a composite organic material comprising an epoxy.

7. The AIP of claim 1, wherein the vertical connectors each comprise a metal pillar including a plated copper pillar.

8. The AIP of claim 1, further comprising an application printed circuit board (PCB), wherein the AIP is assembled on a top surface of the PCB.

9. The AIP of claim 1, wherein the antenna comprises a millimeter wave antenna.

10. The AIP of claim 1, wherein the IC die comprises a radio frequency (RF) die.

11. The AIP of claim 1, wherein a width and a line spacing for the top metal layer and for the bottom metal layer includes a dimension that is less than or equal to 10 μm.

* * * * *